(12) United States Patent
Kawakubo et al.

(10) Patent No.: US 8,395,462 B2
(45) Date of Patent: Mar. 12, 2013

(54) RESONATOR AND OSCILLATOR WITH A TUNING FORK VIBRATOR IN A CUT-OUT PORTION OF A LAYERED BODY

(75) Inventors: Takashi Kawakubo, Kanagawa (JP); Toshihiko Nagano, Kanagawa (JP); Michihiko Nishigaki, Kanagawa (JP); Hiroshi Ono, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/422,023

(22) Filed: Mar. 16, 2012

(65) Prior Publication Data

US 2012/0206018 A1 Aug. 16, 2012

Related U.S. Application Data

(63) Continuation of application No. PCT/JP2009/004920, filed on Sep. 28, 2009.

(51) Int. Cl.
*H03H 9/21* (2006.01)
*H03H 9/10* (2006.01)
*H03B 5/32* (2006.01)
*H03L 1/02* (2006.01)

(52) U.S. Cl. ..... 333/186; 333/187; 333/200; 331/116 R; 331/107 A; 331/156; 331/176

(58) Field of Classification Search .......... 333/186, 333/187, 200; 331/116 R, 107 A, 156, 176; 310/367, 370

See application file for complete search history.

(56) References Cited

U.S. PATENT DOCUMENTS

| | | | | |
|---|---|---|---|---|
| 5,969,257 A | * | 10/1999 | De Bortoli | 73/702 |
| 6,995,622 B2 | | 2/2006 | Partridge et al. | |
| 7,211,926 B2 | * | 5/2007 | Quevy et a | 310/315 |
| 7,221,241 B2 | * | 5/2007 | Lutz et al. | 333/186 |
| 7,427,905 B2 | * | 9/2008 | Lutz et al. | 333/186 |
| 7,745,975 B2 | * | 6/2010 | Asai et al. | 310/331 |
| 7,808,332 B1 | * | 10/2010 | Pedersen et al. | 331/155 |
| 2005/0151592 A1 | | 7/2005 | Partridge et al. | |
| 2007/0182291 A1 | | 8/2007 | Isobe et al. | |

FOREIGN PATENT DOCUMENTS

| | | |
|---|---|---|
| JP | 2000-258164 | 9/2000 |
| JP | 2006-166393 | 6/2006 |
| JP | 2007-518351 | 7/2007 |
| JP | 2007-208890 | 8/2007 |
| JP | 2008-118264 | 5/2008 |

OTHER PUBLICATIONS

M. Koskenvuori et al.; "Fast Dry Fabrication Process With Ultra-Thin Atomic Layer Deposited Mask for Released MEMS-Devices With High Electromechanical Coupling"; Transducers and Eurosensors '07, The 14th International Conference on Solid-State Sensors, Actuators and Microsystems, Lyon, France, Jun. 10-14, 2007, pp. 501-504.*

International Search Report for International Application No. PCT/JP2009/004920 mailed on Nov. 17, 2009.

* cited by examiner

*Primary Examiner* — Barbara Summons
(74) *Attorney, Agent, or Firm* — Turocy & Watson, LLP (57) ABSTRACT

A resonator according to the embodiment includes: a substrate; a flat layered body which is formed above the substrate and is formed with at least a lower electrode, a piezoelectric film and an upper electrode; an anchor portion which fixes the layered body above the substrate; a cut-out portion inside the layered body; a tuning fork vibrator which is formed in the cut-out portion, has both ends supported by the layered body and is formed with at least a lower electrode, a piezoelectric film and an upper electrode; and an envelope which envelopes the layered body and the tuning fork vibrator in a noncontact fashion, and prevents an external force from being applied to the layered body and the tuning fork vibrator.

21 Claims, 10 Drawing Sheets

RESONATOR AND OSCILLATOR WITH A TUNING FORK VIBRATOR IN A CUT-OUT PORTION OF A LAYERED BODY

CROSS-REFERENCE TO RELATED APPLICATION

This application is continuation application based upon the International Application PCT/JP2009/004920, the International Filing Date of which is Sep. 28, 2009, the entire content of which is incorporated herein by reference.

FIELD

Embodiments described herein relate generally to a resonator and an oscillator.

BACKGROUND

Oscillators are widely utilized which use quartz crystal units to generate reference frequencies of electronic devices. When cut at a specific angle from crystalline quartz and resonated in a specific mode, the quartz crystal unit can significantly reduce temperature dependency of a resonance frequency. Typical examples such as AT cut TS (thickness-shear) mode resonators and X cut two-legged tuning fork vibrators are widely utilized.

While the quartz crystal unit has good temperature characteristics, growth of crystalline quartz involves many drawbacks of requiring several months in a high temperature and pressure container, which is called an autoclave, and increasing cost, requiring highly precise processing, requiring mechanical mounting process in an air-tight package to form a resonator and also having a limit in miniaturization of the dimension due to mechanical processing.

Hence, a Si vibrator created by the MEMS technology is recently gaining significant attention. A Si resonator is made on a Si substrate in semiconductor process, so that it is possible to ultra-miniaturize the Si resonator or reduce cost of the Si resonator. Further, by using single crystal Si or sufficiently annealed poly crystal Si as a resonator, resonance can be carried out very stably and a Q value of resonance is also high.

However, unlike a quartz crystal unit, the Si vibrator has temperature dependency of the resonance frequency of about −30 ppm/° C. The temperature dependency mainly derives from temperature dependency of an elastic modulus of Si. An error is about 0.3% at −30° C. to 85° C. which is an operating temperature limit of consumer equipment. Hence, reference frequency oscillators cannot be used without performing some temperature compensation in almost all applied fields.

For this problem, a method of compensating for the temperature according to digital processing at a later stage of a Si oscillation circuit is proposed. That is, apart from a first oscillation circuit having a Si vibrator, a second resonance circuit formed with an inductor and a variable capacitor, a temperature sensor and a PLL circuit are provided. The temperature is compensated for by controlling the frequency of the second resonance circuit at a frequency division ratio set in advance according to the temperature by means of the PLL, based on the resonance frequency of the Si vibrator.

Although this method can provide comparatively high temperature compensation precision, an output is obtained from the second resonance circuit and the second resonance circuit is formed with a LC tank circuit formed with an inductor and a variable capacitance capacitor, and therefore this method involves drawbacks of a small Q value and significant phase noise. Hence, this method cannot be actually applied to a field such as a field of mobile telephones which particularly require stability of oscillation.

DETAILED DESCRIPTION

A resonator according to the embodiment includes: a substrate; a flat layered body which is formed above the substrate and is formed with at least a lower electrode, a piezoelectric film and an upper electrode; an anchor portion which fixes the layered body above the substrate; a tuning fork vibrator which is formed in the cut-out portion of the layered body, has both ends supported by the layered body and is formed with at least a lower electrode, a piezoelectric film and an upper electrode; and an envelope which envelopes the layered body and the tuning fork vibrator in a noncontact fashion, and prevents an external force from being applied to the layered body and the tuning fork vibrator.

Hereinafter, embodiments will be explained referring to the accompanying drawings. In addition, in this description, a resonator refers to a component employing a tuning fork vibrator and a layered body as a main configuration, and an oscillator refers to a device which actually generates a reference frequency by connecting, for example, an electric circuit to the resonator.

(First Embodiment)

A resonator according the embodiment has: a substrate; a flat layered body which is formed above the substrate and has a layered structure formed with at least a lower electrode, a piezoelectric film and an upper electrode; an anchor portion which fixes the layered body above the substrate; a cut-out portion inside the layered body; a tuning fork vibrator which is formed in the cut-out portion, has both ends supported by the layered body and has a layered structure formed with at least a lower electrode, a piezoelectric film and an upper electrode; and an envelope which envelopes the layered body and the tuning fork vibrator in a noncontact fashion, and prevents an external force from being applied to the layered body and the tuning fork vibrator.

The resonator according to the embodiment employs the above configuration. Further, with this resonator, the tuning fork vibrator is formed in the cut-out portion inside the layered body having one end fixed to the substrate, so that it is possible to cancel influences of warpage upon manufacturing or a residual stress produced in the piezoelectric film forming the layered body or the tuning fork vibrator. Furthermore, it is possible to avoid an influence of deformation of the substrate caused by an external force.

Still further, by changing the rate of the piezoelectric film and an electrode at a layered body portion and a tuning fork vibrator portion, it is possible to cause thermal expansion distortion, applies axial distortion to the tuning fork vibrator in a longitudinal direction by means of this thermal expansion distortion and change the resonance frequency.

Moreover, it is possible to apply a bias voltage and cause electrostriction between the layered body and the electrode, apply axial distortion to the tuning fork vibrator in the longitudinal direction by means of this electrostriction and change the resonance frequency. The change in the frequency of the tuning fork vibrator by means of these thermal expansion distortion and electrostriction makes it possible to cancel the temperature dependency of the resonance frequency which the tuning fork vibrator originally has.

Figure 1:
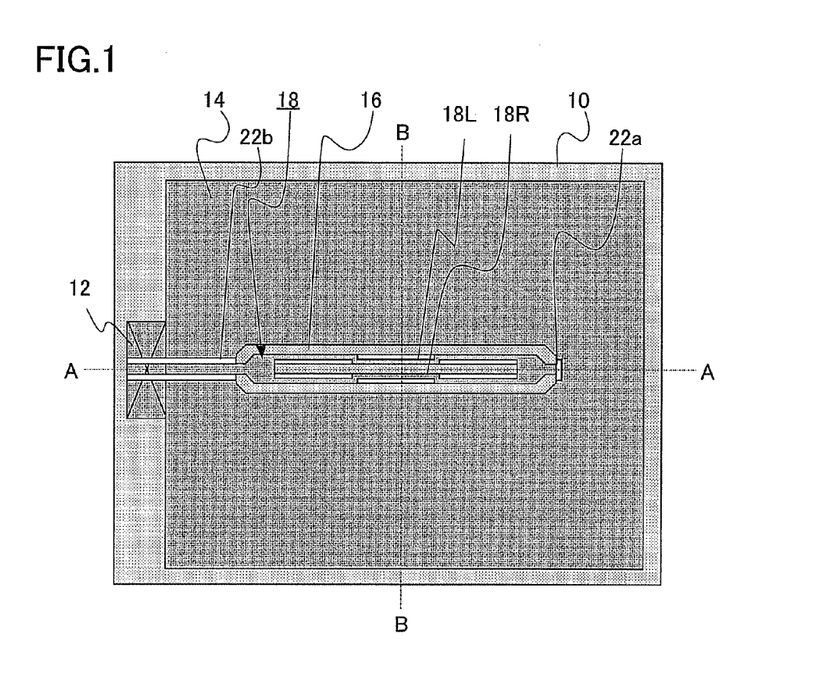
FIG. 1 is a top view of a resonator according to a first embodiment.
Figure 2:
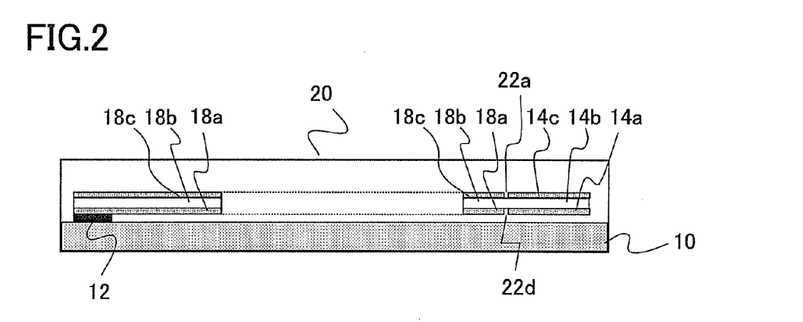
FIG. 2 is a sectional side view taken along a line A-A of the resonator in FIG. 1.
Figure 3:
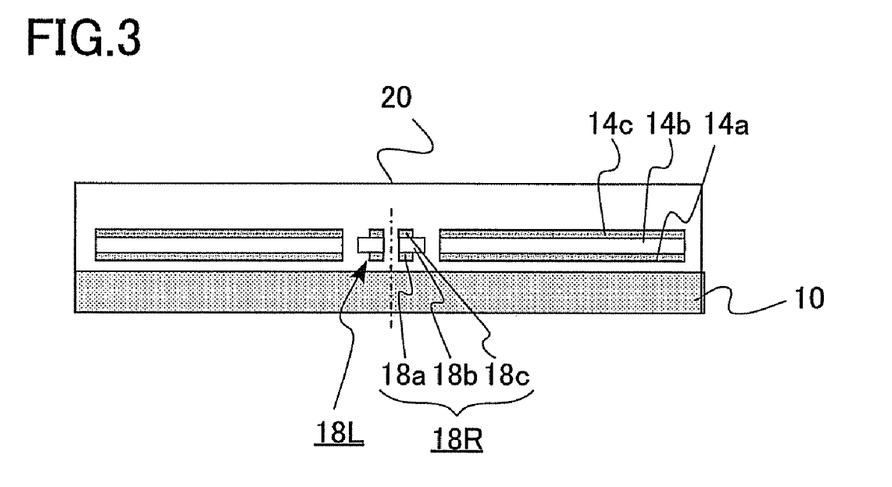
FIG. 3 is a sectional side view taken along a line B-B of the resonator in FIG. 1.

FIG. 1 is a top view of the resonator according to the embodiment. FIG. 2 is a sectional side view taken along a line A-A of the resonator in FIG. 1. FIG. 3 is a sectional side view taken along a line B-B of the resonator in FIG. 1.

This resonator has a substrate 10, an anchor portion 12 fixed to an end of the substrate 10, and a layered body 14 having one end connected to the anchor portion 12 and formed with a lower electrode 14a, a piezoelectric film 14b and an upper electrode 14c. In a cut-out portion 16 inside the layered body 14, a tuning fork vibrator 18 formed with a lower electrode 18a, a piezoelectric film 18b and an upper electrode 18c are formed. Further, the tuning fork vibrator 18 has two vibration legs 18L and 18R. Both ends of the tuning fork vibrator 18 are connected to the layered body 14. Thus, the layered body 14 and the tuning fork vibrator 18 are formed above the substrate 10, and each have a flat shape.

Further, the resonator has an envelope 20 or a housing which envelopes the layered body 14 and the tuning fork vibrator 18 in a noncontact fashion, and prevents an external force from being applied to the layered body 14 and the tuning fork vibrator 18.

When the external force is applied to the substrate 10 and the substrate 10 deforms, the layered body 14 is supported by the substrate 10 only through one anchor portion 12 and the tuning fork vibrator 18 is connected only to the layered body 14, so that it is possible to provide advantages that deformation of the substrate 10 does not affect the layered body 14 and the tuning fork vibrator 18 and does not influence the resonance frequency of the tuning fork vibrator 18.

That is, the anchor portion 12 is configured to absorb deformation due to the external force applied to the substrate 10, and prevent the deformation from affecting the layered body 14 and the tuning fork vibrator 18.

Further, the envelope 20 is configured to prevent the external force from being directly applied to the layered body 14 and the tuning fork vibrator 18. Consequently, it is possible to provide advantages that the external force is not applied to the layered body 14 and the tuning fork vibrator 18, and does not influence the resonance frequency of the tuning fork vibrator 18.

Further, the residual stress is unavoidable upon formation of the piezoelectric films 14b and 18b, and the electrodes 14a, 14c, 18a and 18c. However, when the residual stress is produced in each film, the layered body 14 and the tuning fork vibrator 18 integrally deform and relax the stress such that the total axial stress is 0. Consequently, there are structural advantages that the stress is not applied to the tuning fork vibrator 18 in an axial direction and the residual stress does not influence the resonance frequency.

FIG. 4 is a bird view of one vibration leg 18L of the vibration legs of the tuning fork vibrator. The vibration leg 18L adopts a layered structure formed by layering the lower electrode 18a, the piezoelectric film 18b and the upper electrode 18c in order from the lower surface. The piezoelectric film 18b has polarization in a film thickness direction. Meanwhile, for example, the electrodes 18a and 18c are formed with Al having the thickness of 100 nm, and the piezoelectric film 18b is formed with AlN having the thickness of 1 μm.

Further, the vibration leg 18L is divided into a first portion 18L', a second portion 18L" and a third portion 18L'". In each portion, the electrodes 18a and 18c are formed only on a left half surface or a right half surface.

Figure 4A:
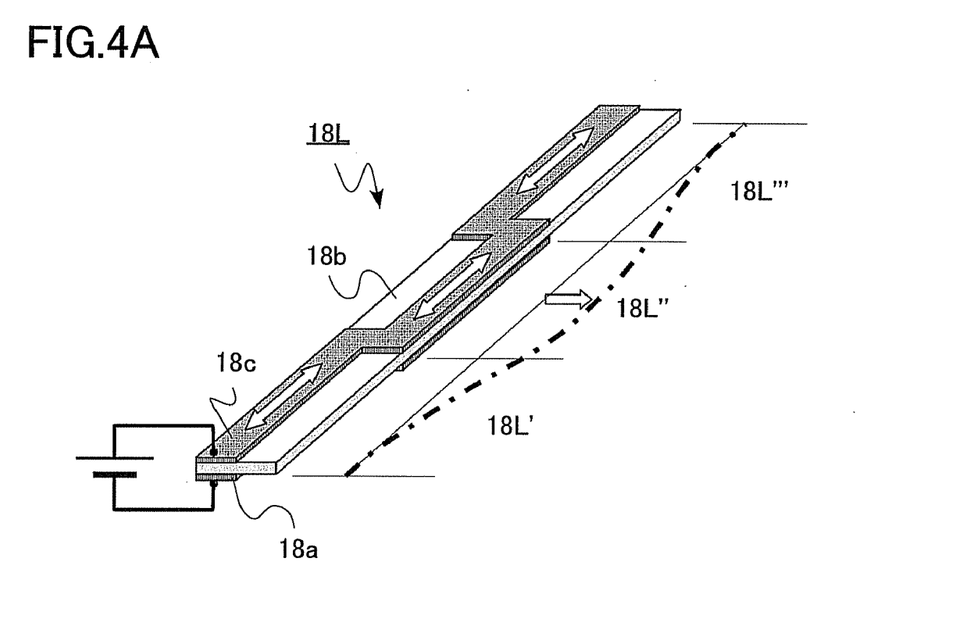
FIG. 4 is a bird view of a vibration leg according to the first embodiment.
Figure 4B:
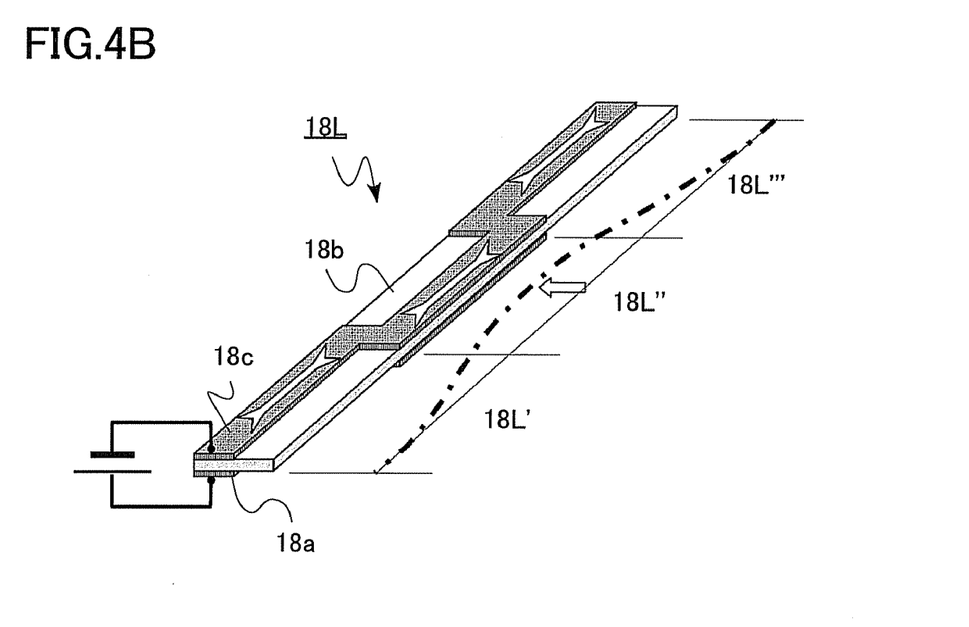

As illustrated in FIG. 4A, a positive voltage is applied to the upper electrode 18c and a negative voltage is applied to the lower electrode 18a, the piezoelectric film 18b sandwiched by the lower electrode 18a and the upper electrode 18c is stretched due to an electrostriction. Hence, as indicated by a dashed-dotted line in FIG. 4A, the center portion 18L" of the vibration leg 18L bends and juts to the right in the plane. As illustrated in FIG. 4B, when a negative voltage is applied to the upper electrode 18c and the positive voltage is applied to the lower electrode 18a, as indicated by a dashed-dotted line in FIG. 4B, the center portion 18L" of the vibration leg 18L bends and juts to the left in the plane.

Consequently, when an alternating voltage corresponding to the resonance frequency of the tuning fork vibrator 18 is applied, the vibration leg 18L bends to the left or right and causes resonance.

Further, as illustrated in FIG. 1, the tuning fork vibrator 18 has the two vibration legs 18L and 18R formed line-symmetrically. Furthermore, when an alternating voltage corresponding to the resonance frequency is applied to the upper electrode 18c and the lower electrode 18a, the two vibration legs 18L and 18R bend and deform with phases opposite to each other in the plane. Hence, the momentum is cancelled, and deformation becomes almost 0 at the anchor portion spaced a little apart from connected portions of the vibration legs, so that it is possible to provide resonance having a very high Q value.

This resonance frequency fr of the tuning fork vibrator is represented by [Equation 1]. Meanwhile, the effect of the electrodes is omitted.

$$f_r = 1.02 \frac{h}{l^2}\left(\frac{E}{\rho}\right)^{1/2}\left(1 + 0.24\left(\frac{l}{h}\right)^2 \varepsilon\right)^{1/2} \quad \text{[Equation 1]}$$

Meanwhile, h is a width of the vibration legs, l is a beam length of the vibration leg, E is an elastic modulus of the piezoelectric film, ρ is a density of the piezoelectric film and ε is distortion (described below).

As a matter of fact, the resonance frequency is in proportion to the first power of the width and the negative second power of the length of the vibration leg. In [Equation 1], the elastic modulus E of the piezoelectric film has negative temperature dependency, and, therefore, when the piezoelectric film is AlN, the resonance frequency fr has temperature dependency of about −25 ppm/° C. When the operating temperature is −20° C. to 85° C., a temperature drift of about 0.26% occurs.

Hence, when this tuning fork vibrator is used for a reference oscillator which is required to have an accurate oscillation frequency, this temperature dependency needs to be compensated for by some method. Further, this tuning fork vibrator has the property of changing the resonance frequency due to the distortion E applied to the tuning fork vibrator in the axial direction.

Next, an operation when a direct current bias voltage is applied to the layered body 14 will be described. The upper electrode 14c of the layered body 14 is insulated from the upper electrode 18c of the tuning fork vibrator 18 by insulating portions 22a and 22b (see FIG. 1). Similarly, the lower electrode 14a of the layered body 14 is insulated from the lower electrode 18a of the tuning fork vibrator 18 by insulating portions 22c and 22d. Consequently, the bias voltage is configured to be independently applied to only an electrode of the layered body 14.

When the bias voltage is applied between the upper electrode 14c and the lower electrode 14a of the layered body 14, with the piezoelectric film 14b, the electrostriction in proportion to a piezoelectric constant d33 is produced in the thickness direction, and the electrostriction in proportion to a piezoelectric constant d31 is produced in an in-plane direction.

Hence, although the electrostriction is uniformly produced in the plane in the layered body 14, the tuning fork vibrator 18 is not constrained in a width direction, and is influenced by the electrostriction produced in the layered body 14 only in a length direction. The width of the tuning fork vibrator 18 is set narrower than the width of the layered body 14, and therefore the electrostriction produced in the layered body 14 is applied almost as is to the tuning fork vibrator 18 in the length direction.

When influenced by the distortion ε in the length direction, the resonance frequency fr of the tuning fork vibrator 18 of a facing tuning fork type is already represented by [Equation 1]. When the vibration leg has a longer length and a narrower width, the sensitivity with respect to the distortion is higher.

Figure 5:
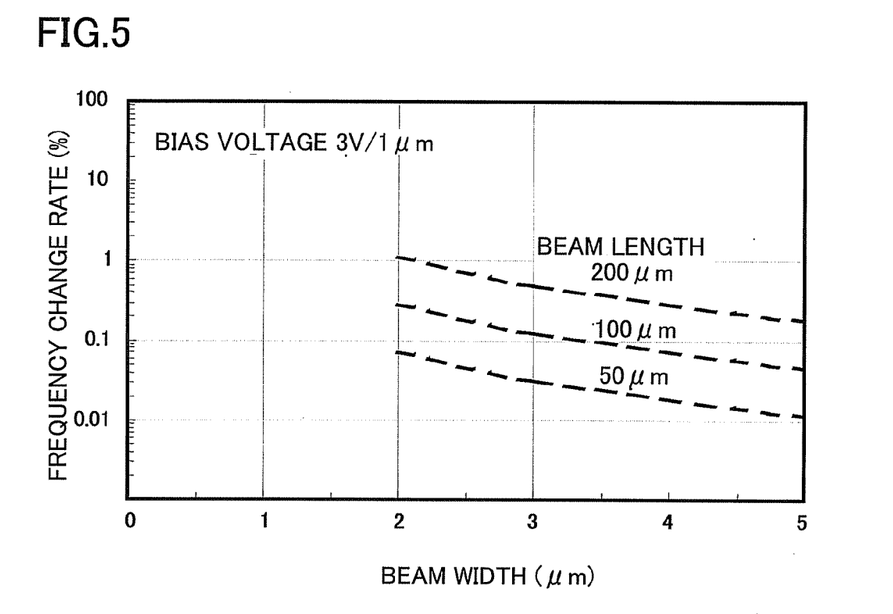
FIG. 5 is an explanatory diagram illustrating a frequency change rate when a bias voltage is applied in the resonator according to the first embodiment.

FIG. 5 is a view illustrating a calculation result of a change rate of the resonance frequency of the tuning fork vibrator 18 when the piezoelectric film is aluminum nitride (AlN) and the bias voltage is applied to the layered body 14. The thickness of the piezoelectric film is 1 μm. When, for example, 3 V of the bias voltage is applied to the layered body, and the beam length of the vibration leg is 200 μm and the width is 2 μm, the resonance frequency changes by about 1%.

As described above, in case of the tuning fork vibrator using AlN, the temperature drift of about 0.26% occurs in the resonance frequency, deriving from the temperature dependency of the elastic modulus. However, by using some temperature measuring means and applying a temperature compensating bias voltage to the above layered body 14, it is possible to cancel the temperature drift in the resonance frequency at a low voltage of about 1 V.

Figure 6:
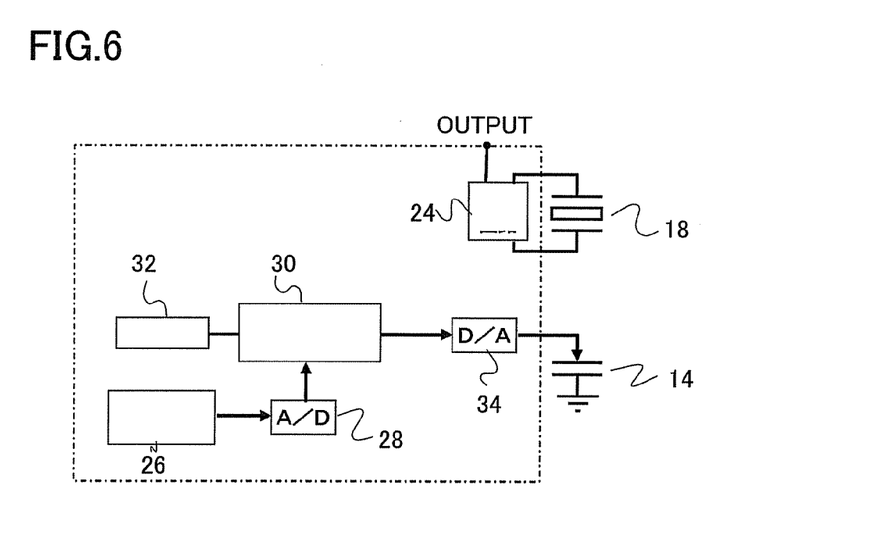
FIG. 6 is a block diagram of an oscillator using the resonator according to the first embodiment.

FIG. 6 is a block diagram of an oscillator using the resonator according to the first embodiment. This oscillator has the above resonator, an oscillation circuit connected to the tuning fork vibrator, a temperature sensor which monitors the temperature of the resonator, and a temperature compensating circuit which calculates the direct current bias voltage to be applied to the tuning fork oscillation, from the temperature monitored by the temperature sensor.

As illustrated in FIG. 6, an oscillation circuit 24 is connected to the tuning fork vibrator 18. For the oscillation circuit 24, a known Colpitts circuit can be used. An output of the temperature sensor 26 is inputted to a digital compensating circuit 30 through an A/D converter 28. Although various sensors can be used for the temperature sensor 26, the output can be obtained by measuring a voltage $V_{BE}$ between a base and an emitter when, for example, a fixed current flows in a bipolar transistor.

The digital compensating circuit 30 calculates a direct current bias voltage, from the temperature measured using a constant stored in a memory circuit 32 in advance. Further, this direct current bias voltage is applied to the upper electrode 14c and the lower electrode 14a of the layered body 14 through the D/A converter 34. Thus, the temperature of the resonance frequency of the tuning fork vibrator 18 is compensated for and the resonance frequency is outputted.

Although a method has been described of compensating for the temperature dependency of the resonance frequency of the tuning fork vibrator 18 by applying the direct current bias voltage to the layered body 14, it is also possible to provide exactly the same effect by a method of applying the bias voltage between the lower electrode 18a and the upper electrode 18c of the tuning fork vibrator 18.

That is, a positive electrostriction is produced in the layered body 14 by applying the positive bias voltage to the layered body 14. Further, this electrostriction applies tensile distortion to the tuning fork vibrator 18 and increases the resonance frequency of the tuning fork vibrator 18, so that it is possible to cancel the temperature dependency of the resonance frequency.

Similarly, by applying the negative bias voltage to the tuning fork vibrator 18, a negative electrostriction is produced in the tuning fork vibrator 18. Further, this electrostriction applies tensile distortion to the tuning fork vibrator 18 and increases the resonance frequency of the tuning fork vibrator 18, so that it is possible to cancel the temperature dependency of the resonance frequency.

Figure 7:
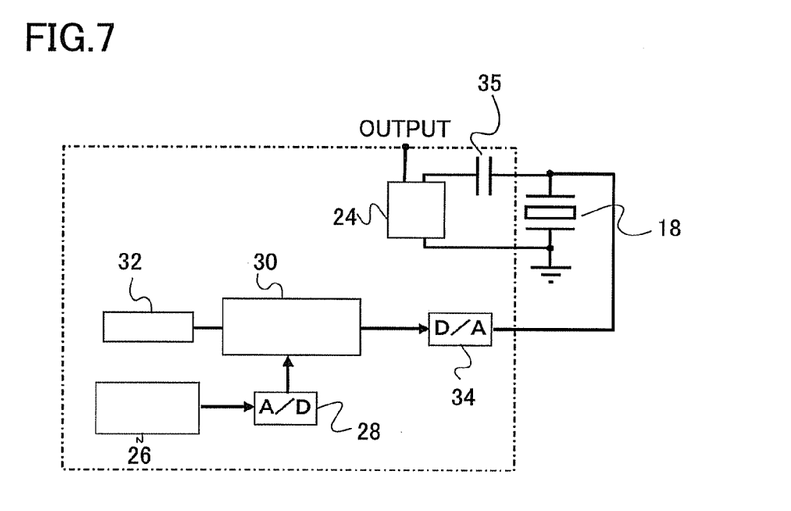
FIG. 7 is a block diagram of another oscillator using the resonator according to the first embodiment.

FIG. 7 is a block diagram of the oscillator when the direct current bias voltage is applied to the tuning fork vibrator 18. This oscillator has the above resonator, an oscillation circuit connected to the tuning fork vibrator, a temperature sensor which monitors the temperature of the resonator, and a temperature compensating circuit which calculates the direct current bias voltage to be applied to the tuning fork oscillation, from the temperature monitored by the temperature sensor.

The oscillation circuit 24 and a bias voltage applying circuit (not illustrated) are connected to the tuning fork vibrator 18. To prevent the direct current bias voltage from being applied to the oscillation circuit 24, a capacitor 35 which has a sufficiently low impedance for the resonance frequency is provided between the oscillation circuit 24 and the tuning fork vibrator 18, so that it is possible to block the direct current component.

Next, the influence of an electrode coverage of the tuning fork vibrator on the resonance frequency will be studied. As illustrated in FIG. 1, almost the entire surface of the layered body 14 is covered by the lower electrode 14a and the upper electrode 14c. By contrast with this, as illustrated in FIG. 4, the tuning fork vibrator 18 is only partially covered by the lower electrode 18a and the upper electrode 18c.

That is, the rate of the area of the lower electrode and the upper electrode with respect to the area of the piezoelectric film in the tuning fork oscillator is lower than the rate of the area of the lower electrode and the upper electrode with respect to the area of the piezoelectric film in the layered body.

The piezoelectric films 14b and 18b, and the electrodes 14a, 14c, 18a and 18c have different thermal expansion coefficients. Hence, thermal expansion distortion occurs between the tuning fork vibrator 18 and the layered body 14 following fluctuation of the temperature. The thermal expansion distortion $\epsilon_{tx}$ is calculated according to [Equation 2].

$$\varepsilon_{tx} = (c_{ps} - c_{rs})\Delta T(\alpha_{el} - \alpha_{pz})\frac{2E_{el}t_{el}}{2E_{el}t_{el} + E_{pz}t_{pz}} \quad \text{[Equation 2]}$$

Meanwhile, $c_{ps}$ is an electrode coverage of the layered body, $c_{rs}$ is an electrode coverage of the tuning fork vibrator, $\Delta T$ is temperature fluctuation, $\alpha_{el}$ is a thermal expansion coefficient of an electrode, $\alpha_{pz}$ is a thermal expansion coefficient of the piezoelectric film, $E_{el}$ is a vertical elastic modulus of the electrode, $E_{pz}$ is a vertical elastic modulus of the piezoelectric film, $t_{el}$ is a thickness of the electrode and $t_{pz}$ is a thickness of the piezoelectric film.

Figure 8:
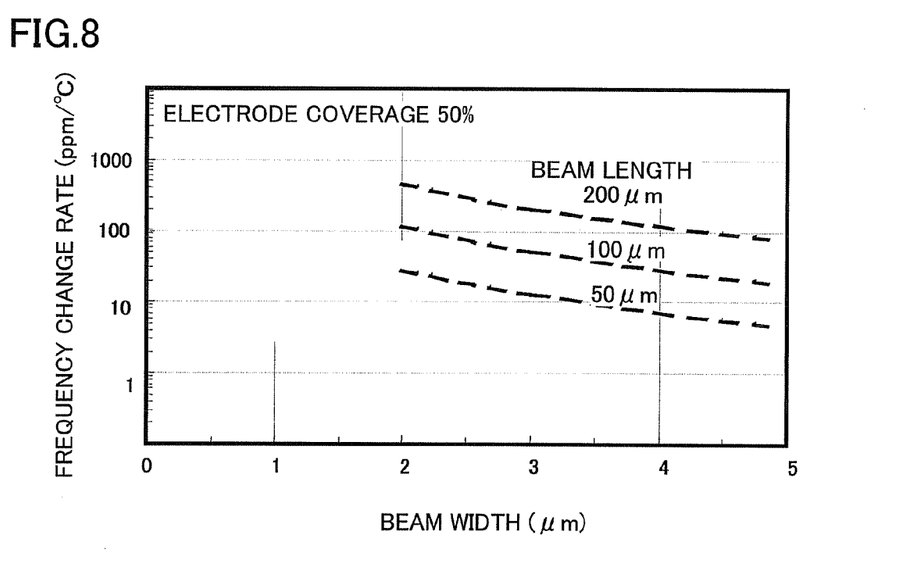
FIG. 8 is an explanatory diagram illustrating an influence of electrode coverage of a tuning fork vibrator on the resonator according to the first embodiment.

FIG. 8 is a view illustrating a frequency change rate with respect to a temperature change of the tuning fork vibrator when Al having the thickness of 0.1 μm is used for the upper and lower electrodes, AlN having the thickness of 1 μm is used for the piezoelectric film, the electrode coverage of the layered body 14 is 100% and the electrode coverage of the tuning fork vibrator 18 is 50%. When, for example, the beam length of the vibration leg is 100 μm and the beam width is 4 μm, the frequency change rate with respect to the temperature is about 25 ppm/° C. As described above, the temperature change rate of the resonance frequency deriving from the temperature dependency of the elastic modulus of the tuning fork vibrator is about −25 ppm/° C., and, consequently, can be almost cancelled by the temperature change rate deriving from the difference in the thermal expansion rate. Consequently, it is possible to realize the tuning fork vibrator having an almost fixed resonance frequency for which the temperature is compensated.

The method has been described of compensating for the temperature dependency of the resonance frequency of the tuning fork vibrator 18 by increasing the electrode coverage of the layered body 14 higher than the electrode coverage of the tuning fork vibrator 18. As a matter of fact, the same effect can also be provided by a method of increasing an electrode thickness of the layered body 14 greater than an electrode thickness of the tuning fork vibrator 18 or a method of covering part of the layered body 14 with a third film having a higher thermal expansion coefficient than the piezoelectric film 14b of the layered body 14.

That is, by increasing the electrode coverage of the layered body 14 higher than the electrode coverage of the tuning fork vibrator 18, it is possible to increase an average thermal expansion coefficient of the layered body 14 higher than an average thermal expansion coefficient of the tuning fork vibrator 18, apply tensile distortion to the tuning fork vibrator 18 following a temperature rise and cancel the temperature dependency by the phenomenon that the resonance frequency of the tuning fork vibrator 18 increases.

Similarly, by increasing the electrode thickness of the layered body 14 greater than the electrode thickness of the tuning fork vibrator 18, it is possible to increase the average thermal expansion coefficient of the layered body 14 higher than the average thermal expansion coefficient of the tuning fork vibrator 18 in the axial direction of the tuning fork vibrator. With this structure, the tensile distortion is applied to the tuning fork vibrator 18 following a temperature rise, and the resonance frequency of the tuning fork vibrator 18 increases, so that it is possible to cancel the temperature dependency of the resonance frequency of the tuning fork vibrator 18.

By, for example, performing process of simultaneously forming electrodes of the layered body 14 and the tuning fork vibrator 18 and then performing known lithography and etching, it is possible to increase the electrode thickness of the layered body 14 greater than the electrode thickness of the tuning fork vibrator 18.

Similarly, by covering part of the layered body 14 by means of the third film having a higher thermal expansion coefficient than the piezoelectric film 14b of the layered body 14, it is possible to increase the average thermal expansion coefficient of the layered body 14 higher than the average thermal expansion coefficient of the tuning fork coefficient 18 in the axial direction of the tuning fork vibrator. With this structure, a tensile stress is applied to the tuning fork vibrator 18 following a temperature rise, and the resonance frequency of the tuning fork vibrator 18 increases, so that it is possible to cancel the temperature dependency of the resonance frequency of the tuning fork vibrator 18.

When, for example, AlN is used for the piezoelectric film 14b, it is possible to use for the third film a material having a higher thermal expansion coefficient than AlN such as a metal material of Ti, Ni, Cr or Zn.

To sum up, by increasing the average thermal expansion coefficient of the layered body 14 higher than the average thermal expansion coefficient, of the tuning fork vibrator 18 according to some means seen from the axial direction of the tuning fork vibrator 18, a phenomenon occurs that tensile distortion is applied to the tuning fork vibrator 18 and the resonance frequency of the tuning fork vibrator 18 increases. Consequently, it is possible to cancel the temperature dependency of the resonance frequency of the tuning fork vibrator 18.

Strictly speaking, the thermal expansion rate of the electrode and the piezoelectric film is not linear, and the temperature dependency of the elastic modulus of the piezoelectric film is not linear. Consequently, there is a limit in the temperature compensation effect using the above thermal expansion distortion. When the temperature is compensated for more strictly, it goes without saying that it is possible to combine a function of the above temperature compensation using the thermal expansion distortion and the function of temperature compensation of applying the bias voltage to the layered body.

The resonator according to the embodiment can be manufactured using existing process. FIG. 9 is a process schematic cross section illustrating a method of manufacturing the resonator according to the embodiment. FIG. 9 illustrates the cross section taken along the A-A line in FIG. 1.

Figures 9A, 9B:
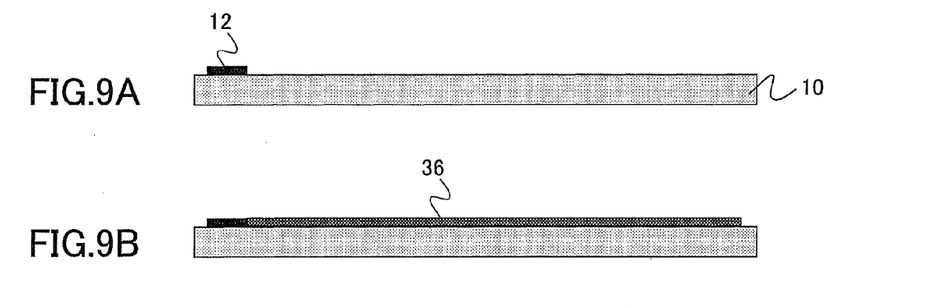
FIG. 9 is a process schematic cross section illustrating a method of manufacturing the resonator according to the first embodiment.

First, as illustrated in FIG. 9A, the anchor portion 12 is formed on the surface of the substrate 10. For example, a silicon oxide film or a silicon nitride film which is frequently used in Si process can be used for the anchor portion 12.

Next, as illustrated in FIG. 9B, a sacrificial layer 36 is formed. Although it is possible to use for the sacrificial layer 36 an inorganic material, a metal material or an organic material which allows selective etching with respect to other film materials, an example will be described here where noncrystalline silicon is used. The sacrificial layer 36 is formed, and then the surface of the anchor portion 12 is exposed using a CMP (chemical mechanical polish) method, for example.

Figure 9C:
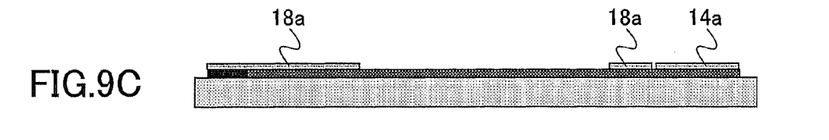

Next, as illustrated in FIG. 9C, a lower electrode is formed on the anchor portion 12 and the sacrificial layer 36. For example, the lower electrode is made by spattering, using Al having the thickness of 100 nm. Pattering is performed using known lithography and an etching method to form the lower electrode 18a of the tuning fork vibrator and the lower electrode 14a of the layered body.

Figure 9D:
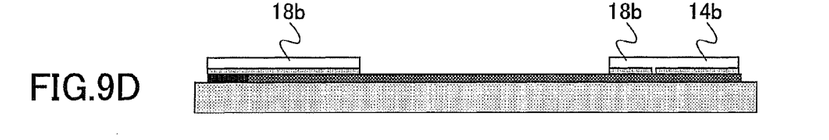

Next, as illustrated in FIG. 9D, the piezoelectric film is formed. For example, the piezoelectric film is made by spattering, using AlN having the thickness of 1 µm. Pattering is performed using the known lithography and the etching method to form the piezoelectric film 14b of the layered body and the piezoelectric film 18b of the tuning fork vibrator.

Figure 9E:
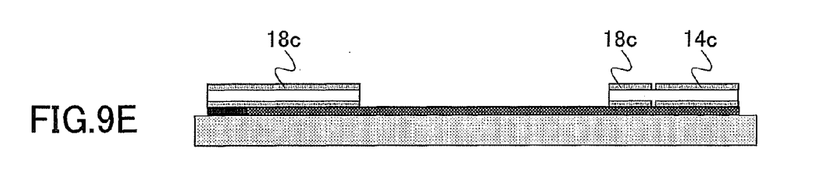

Next, as illustrated in FIG. 9E, the upper electrode is formed. For example, the upper electrode is made by spattering, using Al having the thickness of 100 nm. Pattering is performed using the known lithography and the etching method to form the upper electrode 18c of the tuning fork vibrator and the upper electrode 14c of the layered body.

Figure 9F:
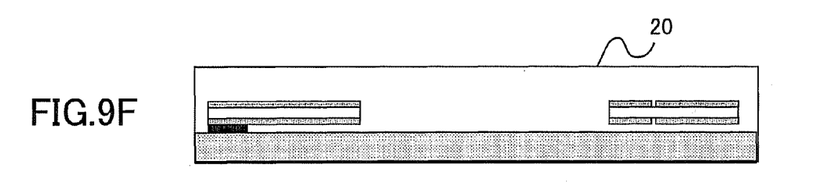

Next, as illustrated in FIG. 9F, the sacrificial layer 36 is removed by selective etching using, for example, $XeF_2$ as etching gas. Then, for example, the resin or metal envelope 20 is formed. The resonator according to the embodiment can be manufactured according to the above process.

In addition, although AlN oriented toward a c axis is used for the piezoelectric film with the embodiment, other piezoelectric films such as ZnO oriented toward the c axis, or PZT (lead zirconate titanate) or BTO (barium titanate) which are ferroelectric materials may be used.

In addition, although Al is used for the electrodes with the embodiment, other metals such as W, Mo, Ta, Nb, Au, Pt or Ru or conductive compounds such as TiN or $RuO_3$ may be used.

(Second Embodiment)

A difference is that a resonator according to the embodiment adopts a five layer structure of a lower electrode, a lower piezoelectric film, a midpoint electrode, an upper piezoelectric film and an upper electrode while the layered body and the tuning fork vibrator adopt a three layer structure of the lower electrode, the piezoelectric film and the upper electrode with the first embodiment, has a three legged tuning fork vibrator bent in the vertical direction with respect to the plane while the tuning fork vibrator is a two legged tuning fork vibrator bent in the in-plane direction with the first embodiment, and adopts a method of supporting a layered body by providing a support portion bent on both sides of the layered body while the anchor portion is formed at one end of the layered body with the first embodiment. As a matter of fact, the basic structure and role are the same as in the first embodiment, and therefore content overlapping the first embodiment will not be described.

Figure 10:
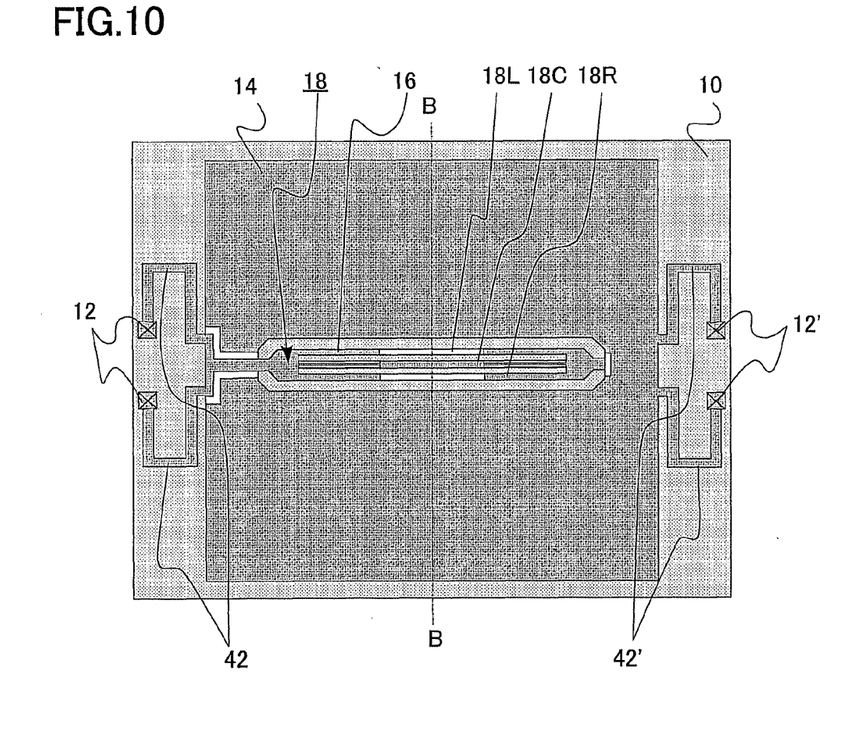
FIG. 10 is a top view of a resonator according to a second embodiment.
Figure 11:
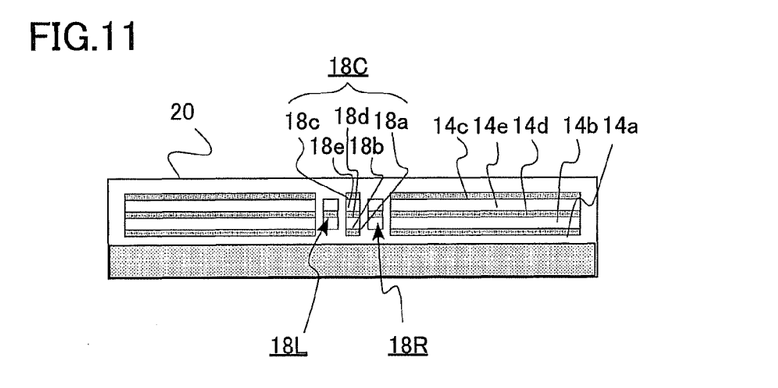
FIG. 11 is a sectional side view taken along a line B-B of the resonator in FIG. 10.

FIG. 10 is a top view of a resonator according to the embodiment. FIG. 11 is a sectional side view taken along a line B-B of the resonator in FIG. 1. This resonator has a substrate 10, a plurality of, that is, four anchor portions 12 and 12' fixed to both ends of the substrate 10, connection beams 42 and 42' which are four bent support portions having one ends connected to the anchor portions 12 and 12' and having the other ends connected to a layered body 14, and the layered body 14. That is, the anchor portions 12 and 12' and the layered body 14 are connected through the connection beams 42 and 42'. A tuning fork vibrator 18 is formed in a cut-out portion 16 inside the layered body 14, and both ends of the tuning fork vibrator 18 are connected to the layered body 14.

Further, the resonator has, an envelope 20 which envelopes the layered body 14 and the tuning fork vibrator 18 in a noncontact fashion and prevents an external force from being applied to the layered body 14 and the tuning fork vibrator 18.

Thus, the layered body 14 and the tuning fork vibrator 18 are formed above the substrate 10, and each have a flat shape. The layered body 14 is formed with a lower electrode 14a, a lower piezoelectric film 14b, a midpoint electrode 14d, an upper piezoelectric film 14e and an upper electrode 14c, and, similarly, the tuning fork vibrator 18 is formed with a lower electrode 18a, a lower piezoelectric film 18b, a midpoint electrode 18d, an upper piezoelectric film 18e and an upper electrode 18c. The tuning fork vibrator 18 has three vibration legs 18L, 18C and 18R.

Each of the electrodes 18a, 18d and 18e of the tuning fork vibrator 18 is electrically connected to the anchor portion 12 through the two connection beams 42. By contrast with this, each of the electrodes 14a, 14d and 14e of the layered body is electrically connected to the anchor portions 12' through the two connection beams 42'.

When the external force is applied to the substrate 10 and the substrate 10 deforms, the layered body 14 is connected to the substrate 10 through the four bent support portions 42 to 42' and the tuning fork vibrator 18 is connected to only the layered body 14, so that it is possible to provide advantages that deformation of the substrate 10 is absorbed by deformation of the bent support portions 42 to 42' and does not affect the layered body 14 and the tuning fork vibrator 18, and does not influence the resonance frequency of the tuning fork vibrator.

Further, the envelope 20 is configured to prevent the external force from being applied to the layered body 14 and the tuning fork vibrator 18. Consequently, it is possible to provide advantages that the external force is not applied to the layered body 14 and the tuning fork vibrator 18, and does not influence the resonance frequency of the tuning fork vibrator 18.

Further, although the residual stress is unavoidable upon formation of the piezoelectric films 14b and 18b and the electrodes 14a, 14c, 18a and 18c, when the residual stress is produced in each film, the layered body 14 and the tuning fork vibrator 18 integrally deform, the stress is relaxed such that the total axial stress is 0, so that it is possible to provide advantages that the axial stress is not applied to the tuning fork vibrator 18 and the residual stress does not influence the resonance frequency.

Figure 12:
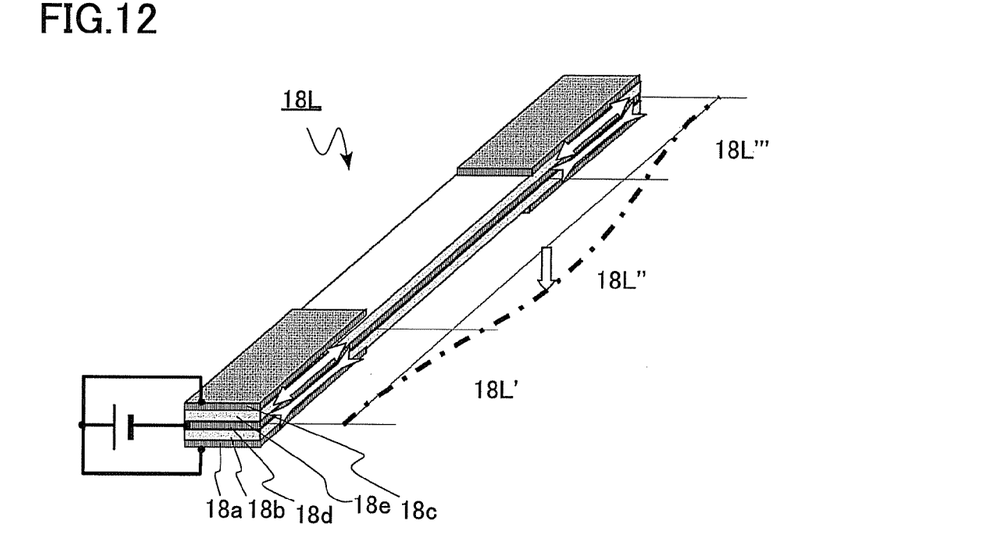
FIG. 12 is a bird view of a vibration leg according to the second embodiment.

FIG. 12 is a bird view of one vibration leg 18L of the tuning fork vibrator 18. The vibration leg 18L adopts a so-called piezoelectric bimorph structure formed by layering the lower electrode 18a, the lower piezoelectric film 18b, the midpoint electrode 18d, the upper piezoelectric film 18e and the upper electrode 18c in this order from the lower surface. The upper and lower piezoelectric films 18b to 18e have polarization in a film thickness direction. Meanwhile, for example, the electrodes 18a, 18d and 18c are formed with Al having the thickness of 100 nm, and the upper and lower piezoelectric films 18b and 18e are formed with AlN having the thickness of 1 µm.

Further, the vibration leg 18L is divided into a first portion 18L', a second portion 18L" and a third portion 18L'". While the first and third portions 18L' and 18L'" have all of the electrodes 18a, 18d and 18c and the piezoelectric films 18b and 18c, the second portion 18L" has only the electrode 18d and the piezoelectric films 18b and 18e.

As illustrated in FIG. 12, when a positive voltage is applied to the upper electrode 18c and the lower electrode 18a and a negative voltage is applied to the midpoint electrode 18d, the upper piezoelectric film 18e sandwiched by the upper electrode 18c and the midpoint electrode 18d is stretched by an electrostriction, and the lower piezoelectric film 18b sandwiched by the lower electrode 18a and the midpoint electrode 18d is contracted, by an electrostriction. Consequently, as indicated by a dashed-dotted line in FIG. 12, the center portion 18L" of the bimorph piezoelectric beam 18L is bent downward vertically to the film surface.

When the voltage of an inverse polarity is applied to each electrode, the center portion 18L" of the piezoelectric beam 18L is bent upward vertically to the film surface. Consequently, an alternating voltage corresponding to the resonance frequency of the vibration leg 18L is applied, the vibration leg 18L bends upward and downward and causes resonance.

Figure 13:
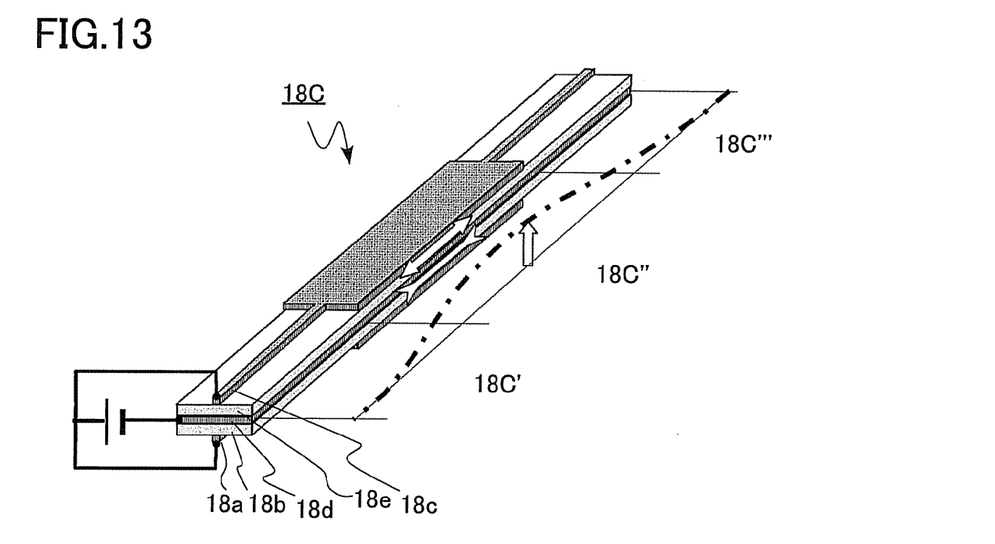
FIG. 13 is a bird view of a vibration leg according to the second embodiment.

FIG. 13 is a bird view of the center vibration leg 18C of the tuning fork vibrator 18. The vibration leg 18C adopts a so-called piezoelectric bimorph structure formed by layering the lower electrode 18a, the lower piezoelectric film 18b, the midpoint electrode 18d, the upper piezoelectric film 18e and the upper electrode 18c in this order from the lower surface. The upper and lower piezoelectric films 18b to 18e have polarization in a film thickness direction.

Further, the vibration leg 18C is divided into a first portion 18C', a second portion 18C" and a third portion 18C'". While the second portion 18C" has all of the electrodes 18a, 18d and 18c and the piezoelectric films 18b and 18c, the midpoint electrode 18d and the piezoelectric films 18b and 18c are formed on the entire surface in the first and third portions 18C' and 18C'", and the upper and lower electrodes 18a and 18c are formed only in the center portion.

As illustrated in FIG. 13, when a positive voltage is applied to the upper electrode 18c and the lower electrode 18a and a negative voltage is applied to the midpoint electrode 18d, the upper piezoelectric film 18e sandwiched by the upper electrode 18c and the midpoint electrode 18d is stretched by an electrostriction, and the lower piezoelectric film 18b sandwiched by the lower electrode 18a and the midpoint electrode 18d is contracted by an electrostriction. Consequently, as indicated by a dashed-dotted line in FIG. 13, the center portion 18C" of the bimorph piezoelectric beam 18C is bent upward vertically to the film surface. When the voltage of an inverse polarity is applied to each electrode, the center portion 18C'" of the piezoelectric beam 18C is bent downward vertically to the film surface.

Consequently, when an alternating voltage corresponding to the resonance frequency of the tuning fork vibrator 18 is applied, the vibration legs 18L and 18R on both sides and the center vibration leg 18C bend up and down with phases opposite to each other, and cause resonance. With this tuning fork, the amplitude of the center vibration leg 18C is twice the amplitude of the vibration legs 18L and 18R on both sides, and the momentum is thereby cancelled, deformation becomes almost 0 at the support portion spaced a little apart from connected portions of the vibration legs and, for example, torsional components are not produced, so that it is possible to provide resonance having a very high Q value.

Also with the embodiment, by applying an adequate bias voltage between the upper and lower electrodes 14a and 14c of the layered body 14, it is possible to apply axial distortion to the fork tuning fork vibrator 18 and compensate for the temperature dependency of the resonance frequency similar to the first embodiment.

Further, also with the embodiment, it is possible to compensate for the temperature dependency of the resonance frequency of the tuning fork vibrator 18 similar to the first embodiment, utilizing thermal expansion distortion due to the difference between the electrode coverage of the layered body 14 and the electrode coverage of the tuning fork vibrator 18.

With the embodiment, the layered body 14 is fixed to the substrate 10 from both sides using the four connection beams 42 and 42", so that it is possible to provide an advantage of fixing the layered body 14 on the substrate 10 with a little deformation volume even when the film formation residual stress is produced in the piezoelectric films 14b and 14e, thereby causing warpage.

With the embodiment, a facing three legged tuning fork bent in an out-of-plane direction is used for the tuning fork vibrator, so that it is possible to provide an advantage of providing resonance of a higher Q value.

(Third Embodiment)

The resonator according to the embodiment has a temperature measuring sub tuning fork vibrator in addition to a main tuning fork vibrator. By designing the main tuning fork vibrator and the sub tuning fork vibrator to have different temperature characteristics of the resonance frequencies, it is possible to find the temperature from the difference between the resonance frequencies of the main tuning fork vibrator and the sub tuning fork vibrator. By arranging the main tuning fork vibrator and the sub tuning fork vibrator in a similar environment, it is possible to accurately measure the temperature of the main tuning fork vibrator. As a matter of fact, the basic structure and role are the same as in the first embodiment, and therefore content overlapping the first embodiment will not be described.

Figure 14:
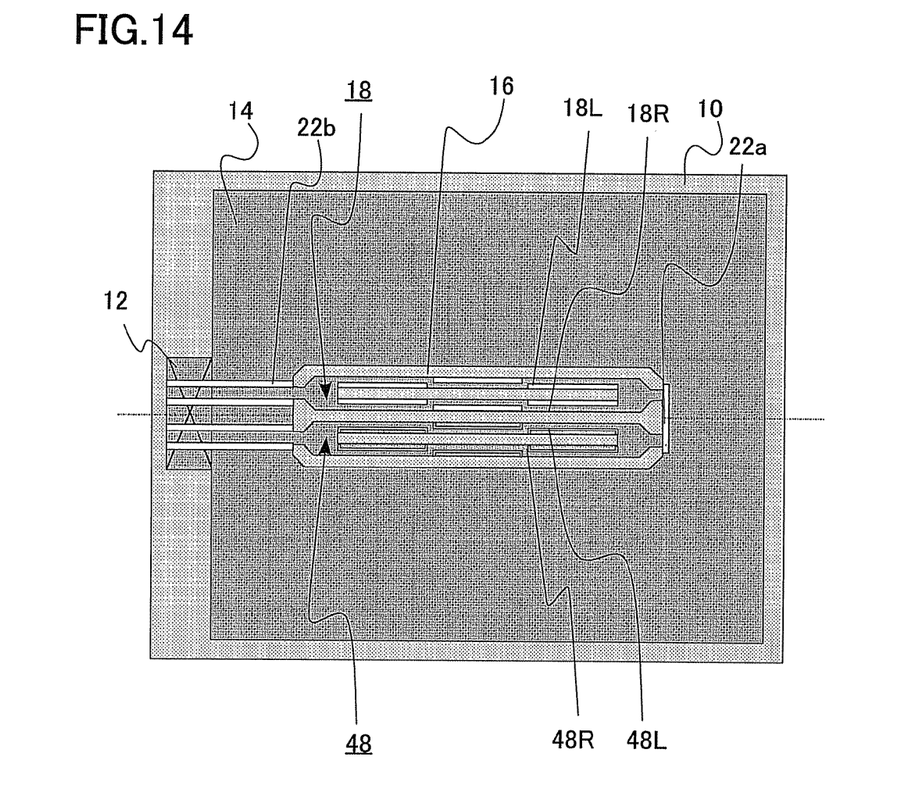
FIG. 14 is a top view of a resonator according to a third embodiment.

FIG. 14 is a top view of the resonator according to the embodiment. This resonator has a substrate 10, an anchor portion 12 fixed to an end of the substrate 10, and a layered body 14 having one end connected to the anchor portion 12 and formed with a lower electrode 14a, a piezoelectric film 14b and an upper electrode 14c. A main tuning fork vibrator 18 formed with a lower electrode 18a, a piezoelectric film 18b and an upper electrode 18c is formed in a cut-out portion 16 inside the layered body 14, and both ends of the main tuning fork vibrator 18 are connected to the layered body 14. Further, a sub tuning fork vibrator 48 formed with a lower electrode 48a, a piezoelectric film 48b and an upper electrode 48c is formed, and both ends of the sub tuning fork vibrator 48 are connected to the layered body 14.

Furthermore, the resonator has an envelope (not illustrated) which envelopes the layered body 14 and the tuning fork vibrator 18 in a noncontact fashion and prevents an external force from being applied to the layered body 14 and the tuning fork vibrator 18.

Thus, the layered body 14, the main tuning fork vibrator 18 and the sub tuning fork vibrator 48 are formed above the substrate 10, and each have a flat shape. The main tuning fork vibrator 18 has two vibration legs 18L and 18R, and the sub tuning fork vibrator 18 also has two vibration legs 48L and 48R.

Figure 15:
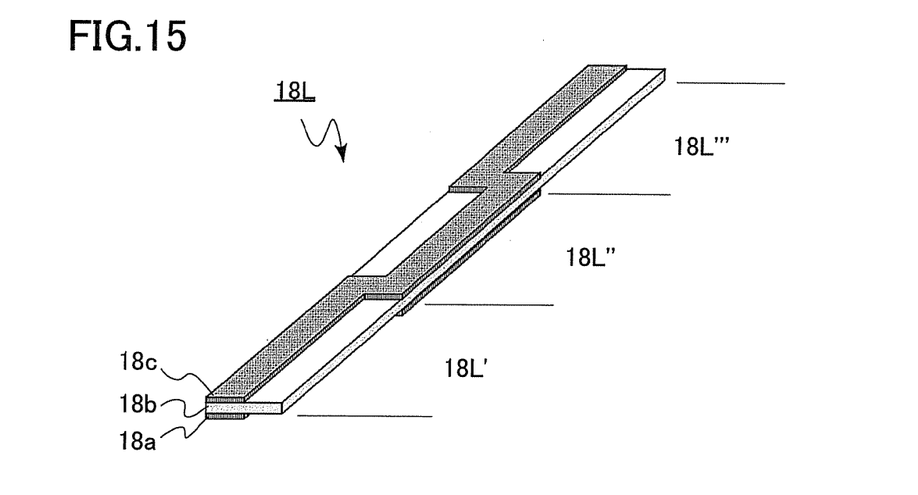
FIG. 15 is a bird view of a vibration leg according to the third embodiment.

FIG. 15 is a bird view of one vibration leg 18L of the main fork tuning vibrator 18. The vibration leg 18L adopts a layered structure formed by layering the lower electrode 18a, the piezoelectric film 18b and the upper electrode 18c in order from the lower surface. The piezoelectric film 18b has polarization in a film thickness direction. Meanwhile, for example, the electrodes 18a and 18c are formed with Al having the thickness of 100 nm, and the piezoelectric film 18b is formed with AlN having the thickness of 1 μm.

Further, the vibration leg 18L is divided into a first portion 18L', a second portion 18L" and a third portion 18L'". In each portion, the upper and lower electrodes 18a and 18c are formed only on a left half surface or a right half surface.

Figure 16:
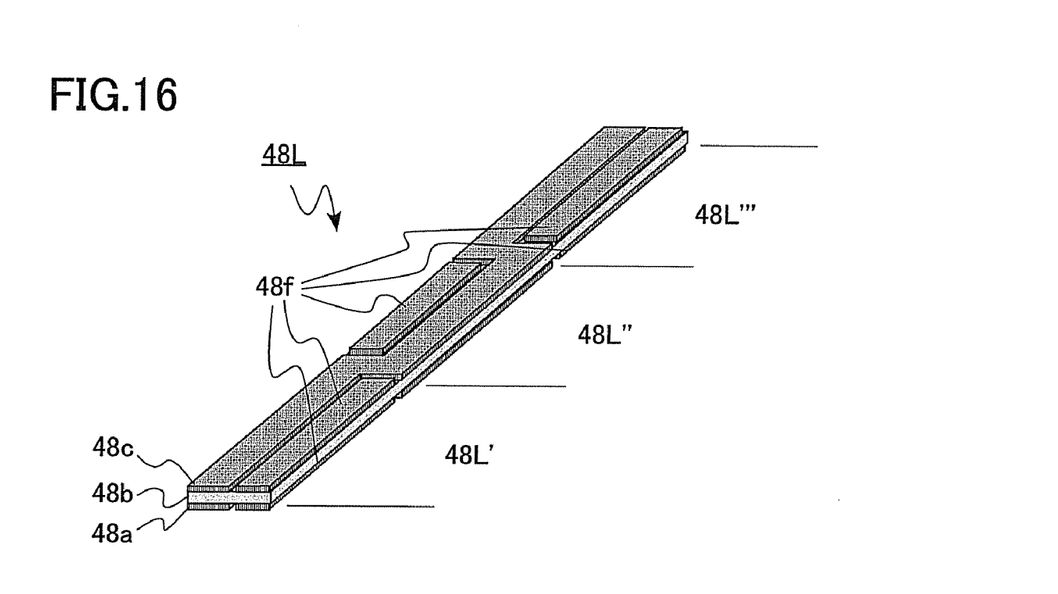
FIG. 16 is a bird view of a vibration leg according to the third embodiment.

FIG. 16 is a bird view of one vibration leg 48L of the sub tuning fork vibrator 48. With the vibration leg 48L, in addition to the same layered structure as the vibration leg 18L of the main tuning fork vibrator 18 which is formed by layering the lower electrode 48a, the piezoelectric film 48b and the upper electrode 48c in this order, dummy electrodes 48f are formed in exposed portions in the upper surface and the lower surface of the piezoelectric film 48b. The dummy electrodes 48f are formed without electrically contacting the lower electrode 48a and the upper electrode 48c.

The main tuning fork vibrator 18 and the sub tuning fork vibrator 48 have slightly different resonance frequencies due to a slight difference in the above structures. Further, the temperature dependency of the resonance frequencies is different due to the difference in the electrode coverage between the main tuning fork vibrator 18 and the sub tuning fork vibrator 48. Consequently, by measuring the difference between the resonance frequencies of the main tuning fork vibrator and the sub tuning fork vibrator, it is possible to measure the temperature of the main tuning fork vibrator.

Similar to the first embodiment, by applying an adequate bias voltage between the upper and lower electrodes 14a and 14c of the layered body 14 using this measured temperature information, it is possible to compensate for the temperature dependency of the resonance frequency of the main tuning fork vibrator 18.

Figure 17:
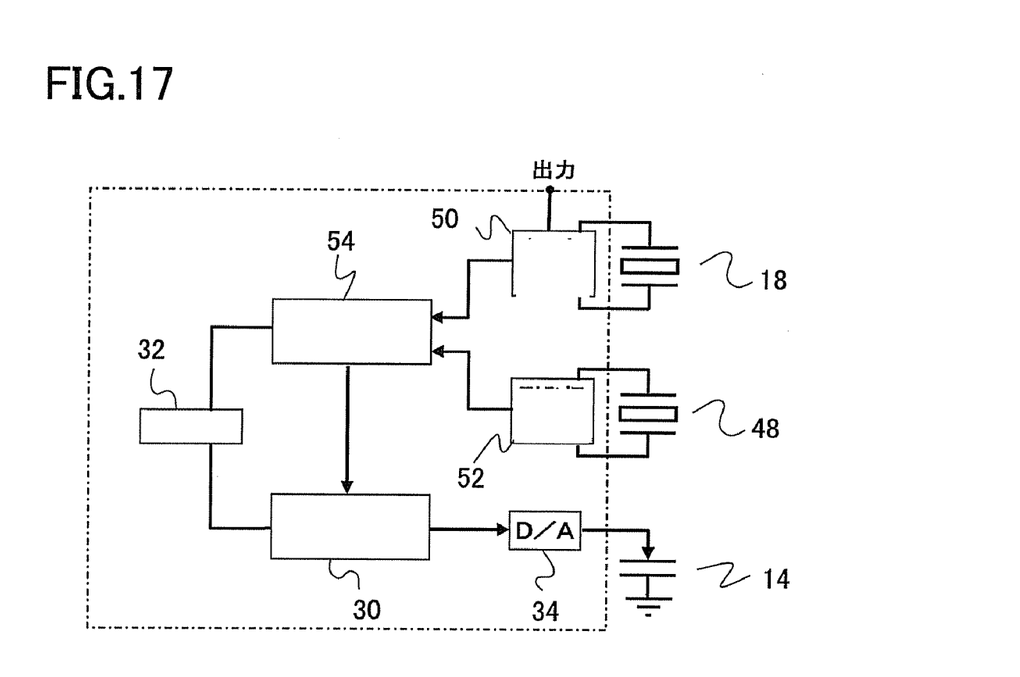
FIG. 17 is a block diagram of an oscillator using the resonator according to the third embodiment.

FIG. 17 is a block diagram of an oscillator using the resonator according to the embodiment. A main oscillation circuit 50 is connected to the main tuning fork vibrator 18. A sub oscillation circuit 52 is connected to the sub tuning fork vibrator 48. Known Colpitts circuits can be used for the main oscillation circuit 50 and the sub oscillation circuit 52. Meanwhile, the sub tuning fork vibrator 48 functions as a temperature monitor.

Outputs of the main oscillation circuit 50 and the sub oscillation circuit 52 are inputted to a temperature detecting circuit 54, and the difference between resonance frequencies is found and is converted into the temperature based on information of a memory circuit 32. The sub tuning fork vibrator 48 and the temperature detecting circuit 54 function as temperature monitors. A method of finding the difference between resonance frequencies may include, for example, a circuit formed with a mixer, a low bandpass filter and a frequency counter.

An output of the temperature detecting circuit 54 is inputted to a digital temperature compensating circuit 30. The digital compensating circuit 30 calculates a direct current bias voltage from the temperature measured using a constant stored in the memory circuit 32 in advance, and applies the bias voltage to the layered body 14 through a D/A converter 34. The temperature of the resonance frequency of the main tuning fork vibrator 18 is compensated for in this way, and the resonance frequency is outputted.

While certain embodiments have been described, these embodiments have been presented by way of example only, and are not intended to limit the scope of the inventions. Indeed, the resonator or the oscillator described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A resonator comprising:
a substrate;
a flat layered body which is formed above the substrate and is formed with at least a lower electrode, a piezoelectric film and an upper electrode;
an anchor portion which fixes the layered body above the substrate;
a cut-out portion inside the layered body;
a tuning fork vibrator which is formed in the cut-out portion, both ends of the tuning fork vibrator are supported by the layered body and the tuning fork vibrator is formed with at least a lower electrode, a piezoelectric film and an upper electrode; and
an envelope which envelopes the layered body and the tuning fork vibrator in a noncontact fashion, and prevents an external force from being applied to the layered body and the tuning fork vibrator.

2. The resonator according to claim 1, wherein the anchor portion is formed at one end of the layered body.

3. The resonator according to claim 1, further comprising a bent support portion, wherein anchor portions are formed at a plurality of ends of the substrate and the anchor portions and the layered body are connected by the bent support portion.

4. The resonator according to claim 1, wherein the layered body and the tuning fork vibrator are each formed with a lower electrode, a first piezoelectric film, a midpoint electrode, a second piezoelectric film and an upper electrode.

5. The resonator according to claim 1, wherein the piezoelectric film is AlN or ZnO oriented in a vertical direction with respect to a film surface.

6. The resonator according to claim 1, wherein, in an axial direction of the tuning fork vibrator, an average thermal expansion coefficient of the layered body is higher than an average thermal expansion coefficient of the tuning fork vibrator.

7. The resonator according to claim 1, further comprising: a first tuning fork vibrator which is formed in the cut-out portion, both ends of the first tuning fork are supported by the layered body and the first tuning fork is formed with at least a lower electrode, a piezoelectric film and an upper electrode; and a second tuning fork vibrator, both ends of the second tuning fork vibrator are supported by the layered body and the second tuning fork vibrator is formed with at least a lower electrode, a piezoelectric film and an upper electrode, wherein temperature characteristics of resonance frequencies of the first and second tuning fork vibrators are different.

8. An oscillator comprising:
a resonator comprising:
a substrate;
a flat layered body which is formed above the substrate and is formed with at least a lower electrode, a piezoelectric film and an upper electrode; an anchor portion which fixes the layered body above the substrate;
a cut-out portion inside the layered body;
a tuning fork vibrator which is formed in the cut-out portion, both ends of the tuning fork vibrator are supported by the layered body and the tuning fork vibrator is formed with at least a lower electrode, a piezoelectric film and an upper electrode; and
an envelope which envelopes the layered body and the tuning fork vibrator in a noncontact fashion, and prevents an external force from being applied to the layered body and the tuning fork vibrator;
an oscillation circuit which is connected to the tuning fork vibrator;

a temperature sensor monitors a temperature of the resonator; and a temperature compensating circuit calculates a direct current bias voltage to be applied to the layered body, from the temperature monitored by the temperature sensor.

9. The oscillator according to claim 8, wherein the anchor portion is formed at one end of the layered body.

10. The oscillator according to claim 8, further comprising a bent support portion, wherein anchor portions are formed at a plurality of ends of the substrate and the anchor portions and the layered body are connected by the bent support portion.

11. The oscillator according to claim 8, wherein the layered body and the tuning fork vibrator are each formed with a lower electrode, a first piezoelectric film, a midpoint electrode, a second piezoelectric film and an upper electrode.

12. The oscillator according to claim 8, wherein the piezoelectric film is AlN or ZnO oriented in a vertical direction with respect to a film surface.

13. The oscillator according to claim 8, wherein, in an axial direction of the tuning fork vibrator, an average thermal expansion coefficient of the layered body is higher than an average thermal expansion coefficient of the tuning fork vibrator.

14. The oscillator according to claim 8, further comprising: a first tuning fork vibrator which is formed in the cut-out portion, both ends of the first tuning fork vibrator are supported by the layered body and the first tuning fork vibrator is formed with at least a lower electrode, a piezoelectric film and an upper electrode; and a second tuning fork vibrator, both ends of the second tuning fork vibrator are supported by the layered body and the second tuning fork vibrator is formed with at least a lower electrode, a piezoelectric film and an upper electrode, wherein temperature characteristics of resonance frequencies of the first and second tuning fork vibrators are different.

15. An oscillator comprising:
an resonator comprising:
  a substrate;
  a flat layered body which is formed above the substrate and is formed with at least a lower electrode, a piezoelectric film and an upper electrode;
  an anchor portion which fixes the layered body above the substrate;
  a cut-out portion inside the layered body;
  a tuning fork vibrator which is formed in the cut-out portion, both ends of the tuning fork vibrator are supported by the layered body and the tuning fork vibrator is formed with at least a lower electrode, a piezoelectric film and an upper electrode; and
an envelope which envelopes the layered body and the tuning fork vibrator in a noncontact fashion, and prevents an external force from being applied to the layered body and the tuning fork vibrator;
an oscillation circuit which is connected to the tuning fork vibrator;
a temperature sensor monitors a temperature of the resonator; and
a temperature compensating circuit calculates a direct current bias voltage to be applied to the tuning fork vibrator from the temperature monitored by the temperature sensor.

16. The oscillator according to claim 15, wherein the anchor portion is formed at one end of the layered body.

17. The oscillator according to claim 15, further comprising a bent support portion, wherein anchor portions are formed at a plurality of ends of the substrate and the anchor portions and the layered body are connected by the bent support portion.

18. The oscillator according to claim 15, wherein the layered body and the tuning fork vibrator are each formed with a lower electrode, a first piezoelectric film, a midpoint electrode, a second piezoelectric film and an upper electrode.

19. The oscillator according to claim 15, wherein the piezoelectric film is AlN or ZnO oriented in a vertical direction with respect to a film surface.

20. The oscillator according to claim 15, wherein, in an axial direction of the tuning fork vibrator, an average thermal expansion coefficient of the layered body is higher than an average thermal expansion coefficient of the tuning fork vibrator.

21. The oscillator according to claim 15, further comprising: a first tuning fork vibrator which is formed in the cut-out portion, both ends of the first tuning fork vibrator are supported by the layered body and the first tuning fork vibrator is formed with at least a lower electrode, a piezoelectric film and an upper electrode; and a second tuning fork vibrator, both ends of the second tuning fork vibrator are supported by the layered body and the second tuning fork vibrator is formed with at least a lower electrode, a piezoelectric film and an upper electrode, wherein temperature characteristics of resonance frequencies of the first and second tuning fork vibrators are different.

* * * * *